United States Patent [19]

Kashiwabara

[11] Patent Number: 4,552,242

[45] Date of Patent: Nov. 12, 1985

[54] COAXIAL TYPE COMPOSITE LOUDSPEAKER

[75] Inventor: Akihiko Kashiwabara, Kawasaki, Japan

[73] Assignee: Soshin Onkyo Works, Ltd., Yokohama, Japan

[21] Appl. No.: 543,453

[22] Filed: Oct. 18, 1983

[30] Foreign Application Priority Data

Apr. 15, 1983 [JP] Japan .................................. 58-56421

[51] Int. Cl.4 ................................................ H05K 5/00

[52] U.S. Cl. ............................ 181/144; 179/115.5 PS

[58] Field of Search ................................ 181/144, 147; 179/115.5 PS

[56] References Cited

U.S. PATENT DOCUMENTS 1,951,692 4/1933 Evens ......................... 179/115.5 PS
4,365,114 12/1982 Soma ............................... 181/144 X
4,401,857 8/1983 Morikawa .............. 179/115.5 PS X

*Primary Examiner*—Russell E. Adams
*Assistant Examiner*—Brian W. Brown
*Attorney, Agent, or Firm*—Wenderoth, Lind & Ponack

[57] ABSTRACT

A coaxial type composite loudspeaker has at least three coaxially arranged loudspeakers of different opening diameters and different allocated frequency bands. This composite loudspeaker can reduce the synergistic interference among the component loudspeakers to prevent deterioration of the characteristics of the respective component loudspeakers and also can centralize the sound sources of the component loudspeakers upon a single axis to enhance the localization of sound image and improve the directivity on the horizontal plane.

6 Claims, 1 Drawing Figure

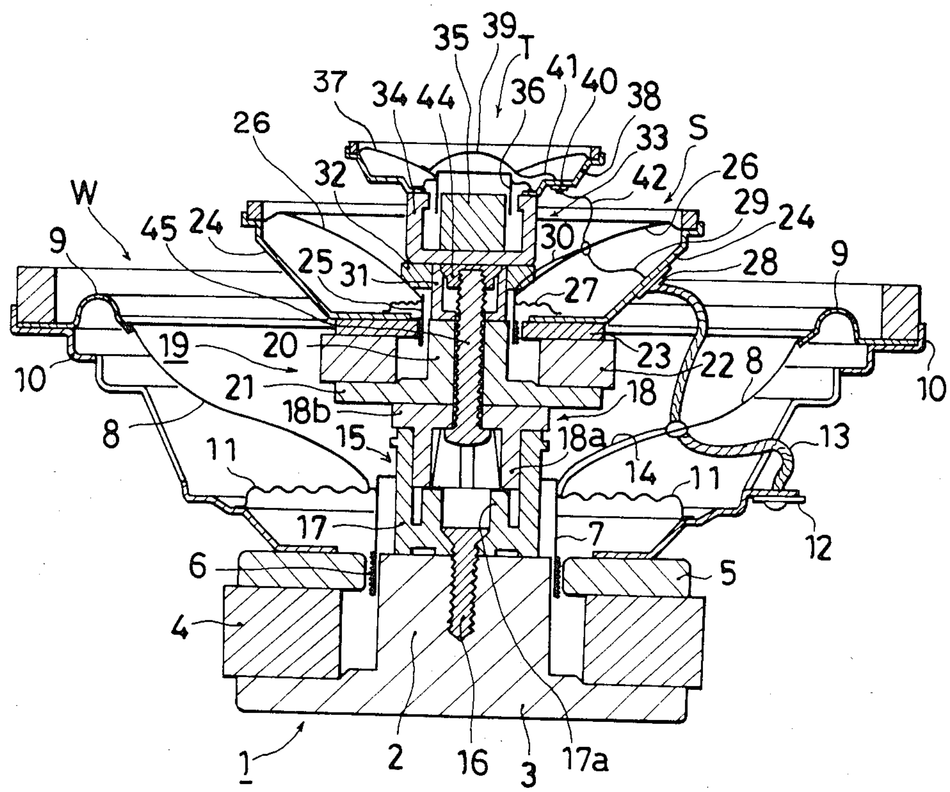
35
39
T
37
34
44
36
41
40
38
33
S
26
32
42
26
29
24
W
45
24
30
9
25
31
28
9
27
20
23
22
8
19
10
10
21
18
18b
8
15
18a
13
11
14
11
17
7
12
6
5
4
1
2
16
3
17a

COAXIAL TYPE COMPOSITE LOUDSPEAKER

BACKGROUND OF THE INVENTION

1. Field of the Invention

This invention relates to a coaxial type composite loudspeaker, and more particularly to a coaxial type composite loudspeaker comprising at least three coaxially arranged loudspeaker of different allocated frequency bands.

2. Description of the Prior Art

A conventionally known three-way compound loudspeaker has a construction in which a loudspeaker responsive only to the intermediate acoustic frequencies and used for reproducing sounds of intermediate pitch (hereinafter referred to as a "squawker") and a loudspeaker responsive only to the high acoustic frequencies and used for reproducing sounds of high pitch (hereinafter referred to as a "tweeter") are disposed through a spacer on the top portion of the center pole of a loudspeaker responsive only to the low acoustic frequencies and used for reproducing sounds of low pitch (hereinafter referred to as a "woofer") and are arranged in a row above the opening of the woofer, a construction in which a woofer has a bridge built on the frame thereof and a squawker and a tweeter are attached to the surface of the bridge and arranged in a row and flush with each other, or in which a woofer is provided on the rear surface of its grilled with a squawker and a tweeter which are arranged in a row.

In all of the constructions described above, however, the squawker and the tweeter obstruct the greater part of the opening of the woofer and consequently the opening area of the woofer is made narrow which prevents the radiation of sounds. This adversely affects the quality of sound and the frequency characteristics. Further, since the sound sources cannot be centralized, the localization of the sound image is shifted and the directional characteristics on the horizontal plane are apt to vary. Furthermore, since the squawker and the tweeter are arranged in a row in the opening of the woofer, the sizes of the squawker and the tweeter are limited. This imposes restrictions on the degree of freedom of designing a speaker system, necessitates changing the cone paper of the woofer into a special shape in order to prevent the squawker and the tweeter from colliding against the cone surface of the woofer, and reduces the quality of sound. Thus, the conventional compound loudspeakers entail a number of problems to be technically solved.

SUMMARY OF THE INVENTION

The principal object of this invention is to provide a coaxial type composite which is capable of reducing the synergistic interference among the component loudspeakers of different frequency bands to thereby prevent deterioration of the characteristics of the respective component loudspeakers and which is also capable of centralizing the sound sources of the component loudspeakers upon a single axis to thereby enhance the localization of sound image and improve the directivity on the horizontal plane.

To accomplish the object described above, according to the present invention, there is provided a coaxial type composite loudspeaker comprising a woofer as a main component and as auxiliary components a plurality of loudspeakers having different opening diameters and different allocated frequency bands, all of which are coaxially connected through spacers.

The aforementioned principal object, other objects, characteristic features and advantages of this invention will become apparent from the description given hereinbelow with reference to the accompanying drawing.

BRIEF DESCRIPTION OF THE DRAWING

The drawing is a longtudinal cross section showing one embodiment of the coaxial type composite loudspeaker according to this invention.

DESCRIPTION OF THE PREFERRED EMBODIMENT

This invention will now be described with reference to the accompanying drawing.

The drawing shows a three-way composite loudspeaker comprising a woofer W, a squawker S having a smaller opening diameter than that of the woofer, and a tweeter T having a smaller opening diameter than that of the squawker, which woofer, squawker and tweeter are coaxially arranged. Denoted by reference numeral 1 is a magnetic circuit portion of the woofer W, which comprises a yoke 3 with a center pole 2, a ring-shaped magnet 4 and a ring-shaped top plate 5. A frame 10 of the woofer W is mounted on the magnetic circuit portion 1. A diaphragm (cone) 8 of the woofer W has its central portion fixed to a bobbin 7 for a voice coil 6 disposed in the magnetic gap of the magnetic circuit portion 1 and has its outer circumferential edge fixed to the peripheral portion of the frame 10 through a free edge 9. A damper 11 is installed between the bobbin 7 and the frame 10. To the frame 10 is attached a terminal 12 from which a litz wire 13 extends. The litz wire 13 from the terminal 12 is connected through the diaphragm 8 to a lead wire 14 from the voice coil 6. The woofer W is constructed as described above.

Numeral 15 represents a spacer comprising a plate rest 17 which is formed of a closed synthetic resin cylinder and is fixed onto the top surface of the center pole 2 of the woofer W by a screw 16, and a mount 18 attached to the rear surface of a yoke 21 constituting a magnetic circuit portion 19 of the squawker S which will be described later. The mount 18 comprises an upper plate **18*b* intimate contact with the rear surface of the yoke 21 of the magnetic circuit portion 19 of the squawker S and a cylindrical base 18*a* having an outside diameter substantially the same as the inside diameter of the plate rest 17 and projecting from the central lower surface of the upper plate 18*b*. The cylindrical base 18*a* and the upper plate 18*b* of the mount 18 are integrally molded of a synthetic resin material. Further, the upper plate 18*b* of the mount 18** has a threaded hole bored therein.

The squawker S installed on the upper surface of the mount 18 of the spacer 15 is constructed similarly to the woofer W and arranged coaxially relative to the woofer W. To be specific, a frame 24 is united with the magnetic circuit portion 19 which comprises the yoke 21 with a center pole 20, a ring-shaped magnet 22 and a ring-shaped top plate 23, a diaphragm (cone) 26 of the squawker S has its central portion fixed to a bobbin 25 for a voice coil disposed in a magnetic gap and has its circumferential edge fixed to the peripheral portion of the frame 24 through a free edge, and the bobbin 25 is supported by a damper 27. A litz wire 29 from a terminal 28 of the frame 24 is connected through the diaphragm 26 to a lead wire 30 from the voice coil, and the terminal 28 is connected through the diaphragm 8 of the woofer W to the litz wire 13 of the woofer W.

Further, the center pole 20 of the yoke 21 constituting the magnetic circuit portion 19 of the squawker S is provided in the center with a threaded hole which extends from the top portion of the center pole 20 to the bottom surface of the yoke 21.

Reference numeral 31 designates a second spacer which is formed of a closed bottom cylinder and is attached to the top surface of the center pole 20 of the squawker S. The second spacer 31 has a threaded hole formed in the central bottom surface thereof and a dust chamber 32 attached to the outer circumference of the upper opening portion thereof. The tweeter T arranged coaxially relative to the squawker S and the woofer W through the second spacer 31 is provided with a magnetic circuit portion 33 which cimprises a U-shaped yoke 34 and a magnet 35. A diaphragm (cone) 37 of the tweeter T has its central portion fixed to a bobbin 36 for a voice coil disposed in a magnetic gap of the magnetic circuit portion 33 and has its circumferential edge fixed to the peripheral portion of a frame 38 through a free edge. The bobbin 36 is supported by a damper. Depicted by numeral 39 is a dust cap, by numeral 40 is a terminal attached to the frame 38. A lead wire 41 from the voice coil of the tweeter T is connected to the terminal 40, which is connected to the squawker S through a litz wire 42.

A nut 44 having an outside diameter slightly smaller than the inside diameter of the second spacer 31 is fixed by welding to the rear surface of the U-shaped yoke 34.

In assembling the coaxial type composite loudspeaker, the aforementioned woofer W, squawker S and tweeter T are first assembled respectively. Then, the plate rest 17 constituting the first spacer 15 is fixed to the top portion of the center pole 2 of the woofer W with the screw 16. Separately, the second spacer 31 is fixed with an adhesive agent etc. to the top portion of the center pole 20 of the squawker S so that the threaded hole formed in the bottom surface of the second spacer 31 is in register with the threaded hole extending axially through the center pole 20 and, at the same time, the mount 18 constituting the first spacer 15 is fixed with an adhesive agent etc. to the rear surface of the yoke 21 so that the threaded hole formed in the upper plate **18*b* of the mount 18 is in register with the threaded hole extending through the yoke 21**.

Subsequently, into the second spacer 31 fixed to the top portion of the center pole 20 of the magnetic circuit portion 19 of the squawker S, is inserted the nut 44 fixed to the yoke 34 of the magnetic circuit portion 33 of the tweeter T so as to be projected from the rear surface of the yoke 34. While maintaining this insertion state, a bolt 45 is inserted from the mount 18 fixed to the rear surface of the yoke 21 of the magnetic circuit portion 19 into the registering threaded holes until the leading end of the bolt 45 is engaged with the nut 44, thereby uniting the squawker S and the tweeter T integrally with each other. Thereafter, the cylindrical base **18*a* of the mount 18 fixed to the rear surface of the yoke 21 of the magnetic circuit portion 19 of the squawker S which has the tweeter T united therewith is snugly fitted in the plate rest 17 fixed to the top portion of the center pole 2 constituting the magnetic circuit portion 1 of the woofer W, and the plate rest 17 and the mount 18** are integrally united with each other by use of an adhesive agent etc. to thereby construct a three-way coaxial type composite loudspeaker.

In the drawing, numeral **17*a* denotes a cylindrical support which projects integrally from the inner bottom of the plate rest 17 into intimate contact with the lower end portion of the cylindrical base 18*a* of the mount 18 snugly fitted in the plate rest 17, thereby preventing the loads of both the squawker S and the tweeter T from being exerted only on the outside cylinder of the plate rest 17**.

In the illustrated embodiment, cylindrical members have been used as the first and second spacers. Optionally, shaft members, such as bolts or support pestles for example, may be used as the spacers.

The three-way composite loudspeaker has been described with reference to the illustrated embodiment. However, this invention is applicable to a four-way composite loudspeaker by attaching to the top surface of the center pole of the tweeter T through a third spacer a loudspeaker responsive only to the ultrahigh acoustic frequencies and used for reproducing sounds of ultrahigh pitch (hereinafter referred to as a "supersonic tweeter").

As described above, the coaxial type composite loudspeaker of this invention comprises a woofer as a main component and as auxiliary components a plurality of loudspeakers having different opening diameters and different allocated frequency bands, all of which are coaxially arranged with spacers intervening between the adjacent components. Therefore, the opening area of the woofer can be kept substantially unobstructed to make the radiation of sounds smooth and good, with the result that adverse effects on the quality of sound or the frequency characteristics can be eliminated. Further, since the sound sources of three or more loudspeakers can be centralized upon a nearly upon a single axis, shift of the sound image can be minimized to enhance the localization of sound image in stereo reproduction and, at the same time, to prevent variation of the directional characteristics on the horizontal plane. In comparison with a conventional compound loudspeaker having a plurality of loudspeakers arranged horizontally in the opening of a woofer, when the woofer has the same opening diameter as that of a woofer used in this invention, a squawker and a tweeter of wider opening diameters can be used in the present invention, thereby providing a composite loudspeaker of better quality of sound. Thus, the present invention has various effects from a practical point of view.

What is claimed is:

1. A coaxial type composite loudspeaker, comprising:

a woofer;

first and second additional loudspeakers coaxial with the axis of said woofer and in front of said woofer, each of said woofer and said first and second additional loudspeakers having a yoke at the rear thereof and a center pole at the front thereof coaxial with the yoke, said woofer and said first and second additional speakers having different diameter front openings and different allocated frequency bands;

spacers between each of the adjacent loudspeakers for mounting said additional loudspeakers coaxially on said woofer; and the first of said spacers being between said woofer and the first additional loudspeaker and disposed immediately in front of said woofer and having a plate rest with a closed bottom cylinder against the center of the front end surface of the center pole of said woofer, a screw extending through the closed bottom and into the center pole to fix the plate rest to said center pole, and a mount having an outer plate with a central hole which is in intimate contact with and disposed centrally on the rear surface of the yoke of said first additional loudspeaker and a cylindrical base projecting from the central rear surface of said outer plate and snugly fitting into the cylinder of said plate rest and adhesively secured therein.

2. A coaxial type composite loudspeaker as claimed in claim 1 in which said auxiliary loudspeakers are a squawker and a tweeter.

3. A coaxial type composite loudspeaker as claimed in claim 2 in which said squawker is said first of said additional speakers.

4. A coaxial type composite loudspeaker as claimed in claim 1 in which the first and second additional loudspeakers are in the recited order outwardly of said woofer, and the diameters of the front openings are successively smaller and the allocated frequency bands are successively higher.

5. A coaxial type composite loudspeaker, comprising:

a woofer;

first and second additional loudspeakers coaxial with the axis of said woofer and in front of said woofer, each of said woofer and said first and second additional loudspeakers having a yoke at the rear thereof and a center pole at the front thereof coaxial with the yoke, said woofer and said first and second additional speakers having different diameter front openings and different allocated frequency bands;

spacers between each of the adjacent loudspeakers for mounting said additional loudspeakers coaxially on said woofer; and the first of said spacers being between said woofer and the first additional loudspeaker and disposed immediately in front of said woofer and having a plate rest with a closed bottom cylinder against the center of the front end surface of the center pole of said woofer, a screw extending through the closed bottom and into the center pole to fix the plate rest to said center pole, and a mount having an outer plate with a central hole which is in intimate contact with and disposed centrally on the rear surface of the yoke of said first additional loudspeaker and a cylindrical base projecting from the central rear surface of said outer plate and snugly fitting into the cylinder of said plate rest and adhesively secured therein;

the second of said spacers being between said first additional loudspeaker and said second additional loudspeaker and having a closed bottom cylinder with a hole centrally of the bottom, said bottom being in intimate contact with the center pole of said first additional loudspeaker and disposed centrally on said center pole and the outer end being engaged with the yoke of said second additional speaker, said center pole of said first additional loudspeaker having a center hole therethrough;

a nut having an outer diameter slightly smaller than the inside diameter of said second spacer and fixed centrally on the rear surface of the yoke of said second additional loudspeaker; and a bolt extending through the central holes of said mount of said first spacer, the center pole of said first additional loudspeaker, the second spacer and threadedly engaged with said nut for securely holding said mount of the first spacer on said first additional loudspeakers and holding said second spacer securely between said first and second additional loudspeakers.

6. A coaxial type composite loudspeaker as claimed in claim 5 in which said plate rest has a projection on said closed bottom projecting outwardly into said cylinder and against which the end of said cylindrical base engages when said cylindrical base is fitted into the cylinder of said plate rest.

* * * * *